(12) United States Patent
Liu et al.

(10) Patent No.: US 11,594,510 B2
(45) Date of Patent: *Feb. 28, 2023

(54) ASSEMBLY PROCESSES FOR SEMICONDUCTOR DEVICE ASSEMBLIES INCLUDING SPACER WITH EMBEDDED SEMICONDUCTOR DIE

(71) Applicant: SEMICONDUCTOR COMPONENTS INDUSTRIES, LLC, Phoenix, AZ (US)

(72) Inventors: Yong Liu, Cumberland Foreside, ME (US); Yusheng Lin, Phoenix, AZ (US); Huibin Chen, Suzhou (CN)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 17/220,661

(22) Filed: Apr. 1, 2021

(65) Prior Publication Data

US 2021/0225797 A1 Jul. 22, 2021

Related U.S. Application Data (63) Continuation of application No. 16/145,918, filed on Sep. 28, 2018, now Pat. No. 10,991,670.

(51) Int. Cl.
| | |
|---|---|
| *H01L 23/00* | (2006.01) |
| *H01L 25/065* | (2006.01) |
| *H01L 23/532* | (2006.01) |
| *H01L 23/373* | (2006.01) |
| *H01L 21/56* | (2006.01) |

(Continued)

(52) U.S. Cl.
CPC ............ *H01L 24/33* (2013.01); *H01L 21/565* (2013.01); *H01L 23/3735* (2013.01);

(Continued)

(58) Field of Classification Search
CPC ... H01L 24/33; H01L 21/565; H01L 23/3735; H01L 23/53238; H01L 25/0655;

(Continued)

(56) References Cited

U.S. PATENT DOCUMENTS

| | | |
|---|---|---|
| 5,543,740 A | 8/1996 | Wong |
| 6,323,549 B1 | 11/2001 | deRochemont et al. |

(Continued)

FOREIGN PATENT DOCUMENTS

DE 102007017831 A1 10/2008

OTHER PUBLICATIONS

J. Gronvall et al., "A New Approach to Power Electronics System Integration with Enhanced Cooling Solutions", Infineon Technologies AG, Apr. 14, 2015.

(Continued)

*Primary Examiner* — Patricia D Valenzuela
(74) *Attorney, Agent, or Firm* — Brake Hughes Bellermann LLP (57) ABSTRACT

In a general aspect, a method for producing a semiconductor device assembly can include defining a cavity in a conductive spacer, and electrically and thermally coupling a semiconductor die with the conductive spacer, such that the semiconductor die is at least partially embedded in the cavity. The semiconductor die can have a first surface having active circuitry included therein, a second surface opposite the first surface, and a plurality of side surfaces each extending between the first surface of the semiconductor die and the second surface of the semiconductor die. The method can also include electrically coupling a direct bonded metal (DBM) substrate with the first surface of the semiconductor die.

20 Claims, 7 Drawing Sheets

(51) Int. Cl.
*H01L 25/07* (2006.01)
*H01L 23/64* (2006.01)

(52) U.S. Cl.
CPC .... *H01L 23/53238* (2013.01); *H01L 25/0655* (2013.01); *H01L 23/645* (2013.01); *H01L 24/32* (2013.01); *H01L 24/83* (2013.01); *H01L 25/072* (2013.01); *H01L 2224/97* (2013.01)

(58) Field of Classification Search
CPC ..... H01L 24/32; H01L 2224/97; H01L 24/29; H01L 2224/131; H01L 2224/26175; H01L 2224/291; H01L 2224/32227; H01L 2224/32237; H01L 2224/32245; H01L 2224/33181; H01L 2224/73253; H01L 2224/8384; H01L 2924/15153; H01L 23/051; H01L 23/3128; H01L 23/49531; H01L 23/49537; H01L 23/49551; H01L 23/49575; H01L 2924/3512; H01L 23/4334; H01L 23/13; H01L 23/49844; H01L 25/074; H01L 25/18; H01L 25/072; H01L 24/83
See application file for complete search history.

(56) References Cited

U.S. PATENT DOCUMENTS

| | | | |
|---|---|---|---|
| 7,047,637 B2 | 5/2006 | deRochemont et al. | |
| 7,068,097 B2 | 6/2006 | Atmur | |
| 7,227,198 B2 | 6/2007 | Pavier et al. | |
| 7,301,235 B2 | 11/2007 | Schaffer et al. | |
| 7,425,757 B2 | 9/2008 | Takubo | |
| 7,492,043 B2 | 2/2009 | Choi et al. | |
| 7,675,148 B2 | 3/2010 | Lim et al. | |
| 7,736,397 B2 | 6/2010 | Lee et al. | |
| 8,018,056 B2 | 9/2011 | Hauenstein | |
| 8,198,139 B2 | 6/2012 | Yang | |
| 8,604,611 B2 | 12/2013 | Hauenstein | |
| 10,991,670 B2 * | 4/2021 | Liu | H01L 21/565 |
| 2003/0106924 A1 | 6/2003 | Nobori et al. | |
| 2008/0023807 A1 | 1/2008 | Noquil et al. | |
| 2010/0308454 A1 * | 12/2010 | Lu | H01L 24/40 |
| | | | 257/690 |
| 2011/0260314 A1 | 10/2011 | Minotti | |
| 2013/0099364 A1 | 4/2013 | Liu et al. | |
| 2017/0103962 A1 | 4/2017 | Oomae et al. | |
| 2017/0287875 A1 | 10/2017 | Gao et al. | |
| 2018/0138152 A1 | 5/2018 | Jong et al. | |
| 2019/0103340 A1 | 4/2019 | Tsuchimochi | |

OTHER PUBLICATIONS

Yasuyuki Sakai et al., "Power Control Unit for High Power Hybrid System", SAE Technical Paper Series, Apr. 16-19, 2007.
Search Report and Preliminary Opinion for German Application No. 10 2019 124 682.2, dated Oct. 2, 2019 (and English translation), 16 pages.

* cited by examiner

ASSEMBLY PROCESSES FOR SEMICONDUCTOR DEVICE ASSEMBLIES INCLUDING SPACER WITH EMBEDDED SEMICONDUCTOR DIE

RELATED APPLICATION

This application a continuation application of U.S. patent application Ser. No. 16/145,918, filed Sep. 28, 2018, the disclosure of which is incorporated by reference herein in its entirety.

TECHNICAL FIELD

This description relates to semiconductor device assemblies. More specifically, this description relates to semiconductor device assemblies (e.g., semiconductor device modules) that include spacers with embedded semiconductor die and related manufacturing processes.

BACKGROUND

Semiconductor device assemblies, such as semiconductor device modules that include multiple semiconductor die (e.g., multi-chip modules) can include spacers (conductive spacers) that are coupled (e.g., electrically and/or thermally coupled) with the semiconductor die. Current approaches for implementing such spacers can have certain drawbacks. For example, mismatches in thermal expansion coefficients (CTEs) between various materials included in such assemblies can cause stress on the semiconductor die, which can result in cracks and/or damage to the semiconductor die. Further, voids in materials (e.g., adhesive materials, such as solder, conductive adhesives, etc.) used to couple the semiconductor die with the spacers can exacerbate CTE mismatch issues, as well as increase thermal resistance and/or electrical resistance between the spacer and the semiconductor die. Such increased thermal and/or electrical resistance can result in reliability issues due to heat generated within the semiconductor device assembly, and/or can adversely affect electrical performance of the semiconductor die and an associated semiconductor device module.

SUMMARY

In a general aspect, a method for producing a semiconductor device assembly can include defining a cavity in a conductive spacer, and electrically and thermally coupling a semiconductor die with the conductive spacer, such that the semiconductor die is at least partially embedded in the cavity. The semiconductor die can have a first surface having active circuitry included therein, a second surface opposite the first surface, and a plurality of side surfaces each extending between the first surface of the semiconductor die and the second surface of the semiconductor die. The method can also include electrically coupling a direct bonded metal (DBM) substrate with the first surface of the semiconductor die.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated.

DETAILED DESCRIPTION

This disclosure relates to implementations of semiconductor device assemblies that can be used to implement, e.g., power semiconductor device assemblies, such as multichip modules (MCMs). Such assemblies can be used in, e.g., automotive applications, industrial applications, etc. For instance, the implementations described herein can be implemented in automotive, high-power modules (AHPMs), such as power converters, ignition circuits, etc.

In the implementations described herein, a spacer (e.g., thermally and/or electrically conductive spacer) can be included in a semiconductor device assembly, where the spacer has a cavity device formed (defined, disposed, etc.) therein, or thereon. A semiconductor die (e.g., a power semiconductor device) can be at least partially embedded (disposed within, etc.) the cavity.

The semiconductor die can be coupled with the spacer (in the cavity) using a conductive adhesive. In some implementations, such a conductive adhesive can include at least one of a solder, a solder preform, a fluxless solder, a stamped solder preform, a solder paste, etc. Such implementations can improve coverage (e.g., solder coverage between the spacer and an associated semiconductor die (e.g., can reduce or eliminate voids) which can, as a result, reduce adverse effects of coefficient of thermal expansion (CTE) mismatches between materials in the assembly (such as mismatch between an epoxy molding compound and a copper spacer) and prevent associated reliability issues, such as die cracking. Further, such implementations can reduce thermal resistance and/or electrical resistance between a spacer and an associated semiconductor die, which can improve thermal dissipation efficiency of an associated assembly, and/or reduce heating due to electrical resistance.

Figure 1:
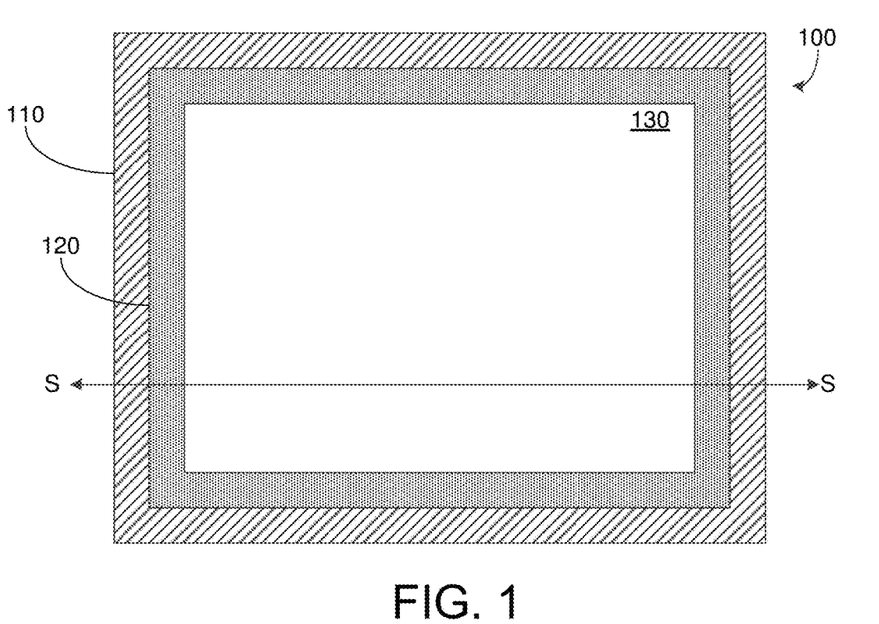
FIG. 1 is a schematic diagram illustrating a plan view of a spacer (e.g., a conductive spacer) with an embedded semiconductor die that can be included in a semiconductor device assembly.

FIG. 1 is a schematic diagram illustrating a plan view of a spacer assembly (assembly) 100 with an embedded semiconductor die that can be included in a semiconductor device assembly. As shown in FIG. 1, the assembly 100 includes a spacer (e.g., a thermally and/or electrically conductive spacer) 110, an adhesive (e.g., a thermally and/or electrically conductive adhesive) 120 and a semiconductor die (die) 130. In some implementations, the spacer 110 can include one or more metals, such as copper, copper alloys, other metal alloys, solder formations etc.

The spacer 110 of FIG. 1 can include a circumferential ring (which also can be referred to as a ring) that extends around a perimeter of a surface of the spacer 110. The ring can define (surround, etc.) a cavity defined (disposed, etc.) in, or on the spacer 110. Depending on the particular implementation, the cavity (and the associated ring) can be formed using a stamping process, an etch process and/or any other appropriate process. As shown in FIG. 1, the adhesive 120 and the die 130 can be disposed in the cavity defined by the ring. In some implementations, the die 130 can be at least partially embedded in the cavity and coupled (e.g., thermally and/or electrically coupled) with the spacer 110 by the adhesive 120. In some implementations, the die 130 can be fully embedded (e.g., substantially fully embedded) in the cavity and coupled (e.g., thermally and/or electrically coupled) with the spacer 110 by the adhesive 120. Example implementations of such (partially and fully) embedded die are shown in, at least, FIGS. 2-5.

In some implementations, the adhesive 120 can include at least one of a solder, a solder preform, a fluxless solder, a stamped solder preform, a solder paste, etc. Depending on the particular implementation, in coupling the die 130 with the spacer 110 in the cavity, the adhesive 120 can be reflowed one or more times. In some implementations, such reflowing of the adhesive 120 can be performed using formic acid and/or a forming gas (e.g., a hydrogen and nitrogen gas), which can be performed with fluxless solder (e.g., included in a paste, a preform, a stamped preform, etc.) and can prevent solder flowing (wicking, etc.) onto a surface of the die 130 including active circuitry and causing electrical shorts.

In some implementations, the die 130 can include a power semiconductor device and/or an integrated circuit. For instance, the die 130 can include a power transistor, a power diode, a control circuit (e.g., for an associated MCM), etc. Such power transistors can include metal-oxide-semiconductor field-effect transistors (MOSFETs), insulated gate bipolar transistors (IGBTs), etc.

In FIG. 1, a section line S-S is shown. The section line S-S is provides, as a general reference, a section line that can correspond with the cross-sectional views of FIGS. 2-5 and 8. That is, while the views of FIGS. 2-5 and 8 illustrate (include) additional elements not shown in FIG. 1, the section line S-S provides a reference to an example sectioning location through respective spacer assemblies (e.g., with embedded semiconductor die) for the various implementations illustrated and described herein.

Figure 2:
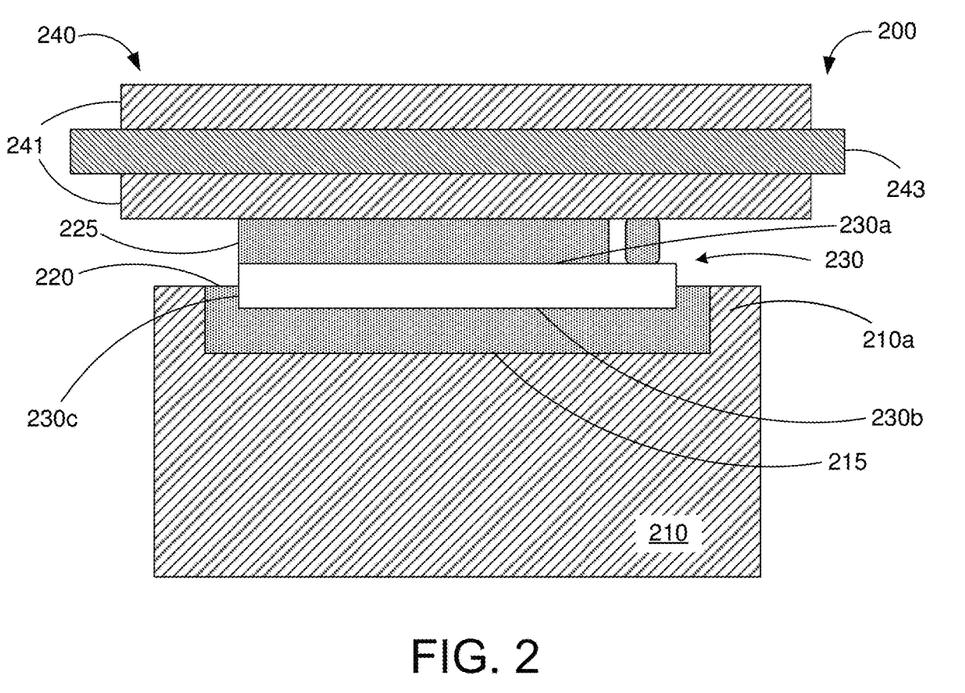
FIG. 2 is a schematic, cross-sectional diagram illustrating a spacer with an embedded semiconductor die and direct bonded metal (DBM) substrate that can be included in a semiconductor device assembly.

FIG. 2 is a schematic, cross-sectional diagram illustrating a spacer assembly (assembly) 200 with an embedded semiconductor die and a direct bonded metal (DBM) substrate that can be included in a semiconductor device assembly. As noted above, the view of the assembly 200 shown in FIG. 2, for some implementations, can be a sectional view along a section line through the assembly 200 that generally corresponds with the section line S-S through the assembly 100 in FIG. 1.

As shown in FIG. 2, the assembly 200 includes a spacer (e.g., a thermally and/or electrically conductive spacer) 210, an adhesive (e.g., a thermally and/or electrically conductive adhesive) 220, a semiconductor die (die) 230 and a direct bonded metal (DBM) substrate 240 (e.g., a direct bonded copper (DBC) substrate, a DBM circuit board, etc.). In some implementations, such as the implementations described herein, the DBM substrate 240 can include a dielectric layer 243 disposed between two metal layers 241 (e.g., circuit layers, printed circuit layers, etc.).

In some implementations, the spacer 210 can include one or more metals, such as copper, copper alloys, other metal alloys, solder formations etc. As with the spacer 110, the spacer 210 of FIG. 2 includes a circumferential ring (can be referred to as a ring) 210a that can extend around a perimeter of a surface of the spacer 210. The ring 210a can define (surround, etc.) a cavity 215 defined (disposed, etc.) in, or on the spacer 210. As with the spacer 110 of FIG. 1, depending on the particular implementation, the cavity 215 (and the associated ring 210a) can be formed using a stamping process, an etch process and/or any other appropriate process. As shown in FIG. 2, the adhesive 220 and the die 230 can be disposed in the cavity 215 defined by the ring 210a. In some implementations, such as the assembly 200, the die 230 can be partially embedded in the cavity and coupled (e.g., thermally and/or electrically coupled) with the spacer 210 by the adhesive 220. That is an upper surface 230a of the die 230 can be higher than (disposed above) an upper surface of the spacer 210 (e.g., an upper surface of the ring 210a).

In some implementations, the adhesive 220 can include at least one of a solder, a solder preform, a fluxless solder, a stamped solder preform, a solder paste, etc. Depending on the particular implementation, in coupling the die 230 with the spacer 210 in the cavity 215, the adhesive (e.g., solder) 220 can be reflowed one or more times. In some implementations, such reflowing of the adhesive 220 can be performed using formic acid and/or a forming gas (e.g., a hydrogen and nitrogen gas), which can be used to perform reflow of fluxless solder (e.g., included in a paste, a preform, a stamped preform, etc.), which can prevent solder flowing (wicking, etc.) onto a surface of the die 230a including active circuitry and causing electrical shorts.

In some implementations, the die 230 can include a power semiconductor device and/or an integrated circuit, such as those described above. As shown in FIG. 2A, the die 230 includes the surface 230a (e.g., a first surface) that can include active circuitry, such as a power semiconductor device and/or an integrated circuit. The die 230 can also include a second surface 230b (e.g., a back side surface) that can include a contact to the substrate (e.g., a bulk) of the die 230. As shown in FIG. 2, the second surface 230b is opposite the first surface 230a. As further shown in FIG. 2, the die 230 can include a plurality of side surfaces 230c (e.g., four side surfaces for a square or rectangular semiconductor die), where each side surface 230c extends between the first surface 230a and the second surface 230b.

In some implementations, such as the assembly 200 shown in FIG. 2, the second surface 230b of the die 230 can be fully embedded in the cavity 215 (and fully embedded in the adhesive 220), while the side surfaces 230c can be partially embedded in the cavity 215 (and partially embedded in the adhesive 220). A volume of the adhesive (solder)

220 can be controlled (e.g., by using a specific volume of solder, solder preform, etc.). Further, a position of the die 230 in the cavity 215 (e.g. a position of the die 230 relative to the spacer 210) can also be controlled (along with the volume of the adhesive 220) to achieve the arrangement shown in FIG. 2. For instance, in some implementations, an alignment jig can be used to control the position of the die 230 relative to the spacer 210 and within the adhesive 220.

In the assembly 200, the die 230 (e.g., active circuitry of the die 230) can be electrically coupled with the DBM substrate 240 (e.g., to one of the metal layers 241) using a conductive adhesive (e.g., solder) 225. In some implementations, the adhesive 225 can include at least one of a solder bump, a preform solder, a solder paste, sintering or a fusion bond, and the die 230 can be coupled with the DBM substrate 240 by reflowing the adhesive (solder) 225.

Figure 3:
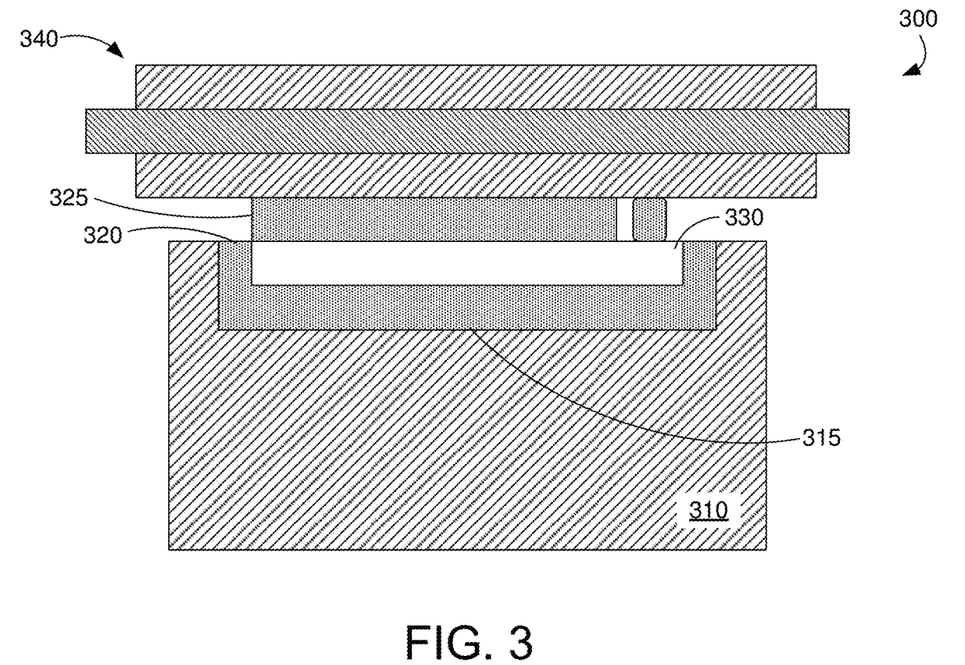
FIG. 3 is a schematic, cross-sectional diagram illustrating another spacer with an embedded semiconductor die and a DBM substrate that can be included in a semiconductor device assembly.

FIG. 3 is a schematic, cross-sectional diagram illustrating another spacer assembly (assembly) 300 with an embedded semiconductor die and a direct bonded metal (DBM) substrate that can be included in a semiconductor device assembly. As noted above, the view of the assembly 300 shown in FIG. 3, for some implementations, can be a sectional view along a section line through the assembly 300 that generally corresponds with the section line S-S through the assembly 100 in FIG. 1.

As shown in FIG. 3, the assembly 300 includes a spacer (e.g., a thermally and/or electrically conductive spacer) 310 having a cavity 315, an adhesive (e.g., a thermally and/or electrically conductive adhesive) 320, a semiconductor die (die) 330, a direct bonded metal (DBM) substrate 340 (e.g., a direct bonded copper (DBC) substrate, a DBM circuit board, etc.), and an adhesive (solder) 325 electrically coupling the die 330 with the DBM substrate 340. The assembly 300 is similar to the assembly 200 of FIG. 2. Accordingly, for purposes of brevity, some details of the assembly 300 that are similar to those of the assembly 200 will not be repeated again with respect to FIG. 3.

As shown in FIG. 3, the adhesive 320 and the die 330 can be disposed in the cavity 315. In the example implementation of FIG. 3, as compared to the example implementation of FIG. 2, the die 330 is fully embedded (substantially fully embedded) in the cavity 315 and coupled (e.g., thermally and/or electrically coupled) with the spacer 310 by the adhesive 320. That is, in the assembly 300, an upper surface of the die 330 (in the arrangement shown in FIG. 3) can be coplanar (substantially coplanar) with an upper surface of the spacer 310. In some implementations, the upper surface of the die 330 can be slightly higher (e.g., slightly above) the upper surface of the spacer 310 (e.g., by a few micrometers), which can prevent the adhesive (solder) 320 from flowing onto the upper surface of the die 330 during reflow processing, preventing shorts between active circuitry and the spacer 310. In some implementations, a film can be applied to the upper surface of the die 330 to protect active circuitry disposed on the die 330 from adhesive (solder) 320 that may flow on the upper surface of the die 330 during reflow processing.

As with the assembly 200, a volume of the adhesive (solder) 320, as well as the position of the die 330 in the cavity 315 relative to the spacer 310, can be controlled to achieve the arrangement shown in FIG. 3. For instance, in some implementations, an alignment jig can be used to control the position of the die 330 relative to the spacer 310 during reflow of the adhesive 320.

Figure 4:
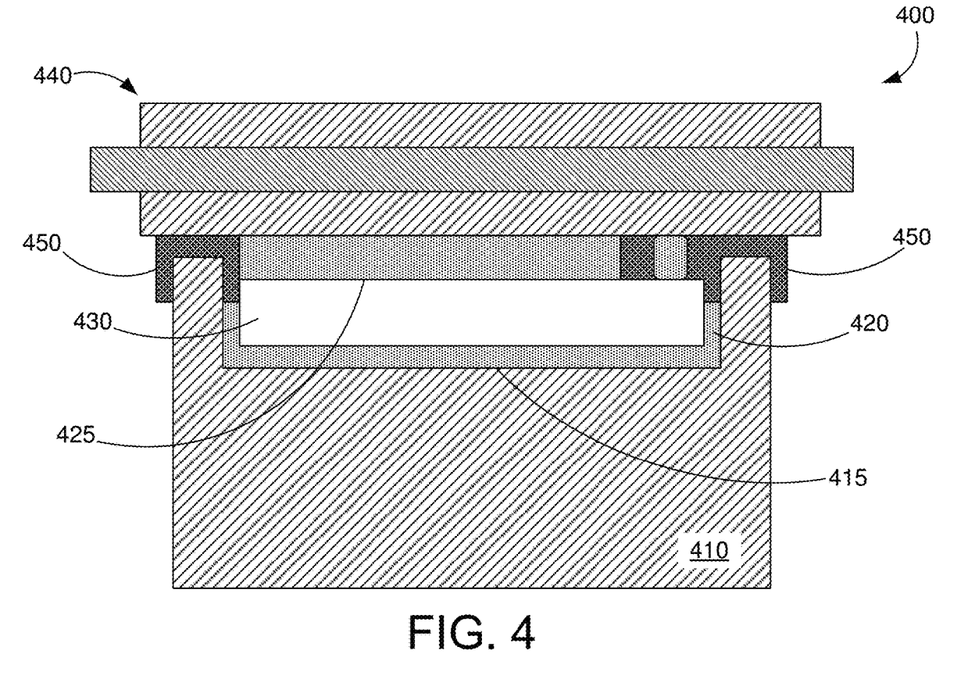
FIG. 4 is a schematic, cross-sectional diagram illustrating yet a spacer with an embedded semiconductor die, a DBM substrate and an injected, low-modulus material that can be included in a semiconductor device assembly.

FIG. 4 is a schematic, cross-sectional diagram illustrating another spacer assembly (assembly) 400 with an embedded semiconductor die and a direct bonded metal (DBM) substrate that can be included in a semiconductor device assembly. As noted above, the view of the assembly 400 shown in FIG. 4, for some implementations, can be a sectional view along a section line through the assembly 400 that generally corresponds with the section line S-S through the assembly 100 in FIG. 1.

As shown in FIG. 4, the assembly 400 includes a spacer (e.g., a thermally and/or electrically conductive spacer) 410 having a cavity 415, an adhesive (e.g., a thermally and/or electrically conductive adhesive) 420, a semiconductor die (die) 430, a direct bonded metal (DBM) substrate 440 (e.g., a direct bonded copper (DBC) substrate, a DBM circuit board, etc.), and an adhesive (solder) 425 electrically coupling the die 430 with the DBM substrate 440. The assembly 400 is similar to the assembly 200 of FIG. 2 and the assembly 300 of FIG. 3. Accordingly, for purposes of brevity, some details of the assembly 400 that are similar to those of the assemblies 200 and 300 will not be repeated again with respect to FIG. 4.

As shown in FIG. 4, the adhesive 420 and the die 430 can be disposed in the cavity 415. In the example implementation of FIG. 4, as compared to the example implementations of FIGS. 2 and 3, the adhesive 420 and the die 430 are fully embedded and recessed in the cavity 415. The die 430 is coupled (e.g., thermally and/or electrically coupled) with the spacer 410 by the adhesive 420. That is, in the assembly 400, an upper surface of the die 430 (in the arrangement shown in FIG. 4) can be disposed below an upper surface of the spacer 410 (e.g., an upper surface of a circumferential ring defining the cavity 415). In some implementations, the volume of the adhesive 420 used can be such that the upper surface of the adhesive 420 is below the upper surface of the die 430 (as shown in FIG. 4), e.g., to prevent adhesive (solder) 420 from flowing onto the upper surface of the die 430 (during reflow) and causing electrical shorts between active circuitry disposed on the die 430 and the spacer 410.

As shown in FIG. 4, the assembly 400 can also include a low-modulus encapsulation material (such as a gel, an epoxy, a resin, an epoxy material, etc.) 450. In some implementations, the low-modulus material 450 can be a silicone-based gel material, or other non-conductive, low-modulus gel, or other material. In some implementations, the low-modulus encapsulation material 450 can have a modulus that is less than a modulus of the die 430, and/or less than a modulus of a molding compound used to molding the assembly 400 (e.g., such as the molding compound 860 shown in FIG. 8).

The encapsulation material 450, as shown in FIG. 4, can be disposed between the spacer 410 and the DBM substrate 440, between the adhesive 420 and the DBM substrate 440, and between the die 430 and the DBM substrate 440. In some implementations, the encapsulation material 450 can be injected into the assembly 400. In some implementations, the encapsulation material 450 can reduce (e.g., absorb) stress on the die 430 due to CTE mismatches, e.g., between materials in an associated semiconductor device assembly (e.g., between the spacer 410 and an epoxy molding compound), which can reduce or eliminate cracking (e.g. ratcheting cracks) of the die 430.

Figure 5:
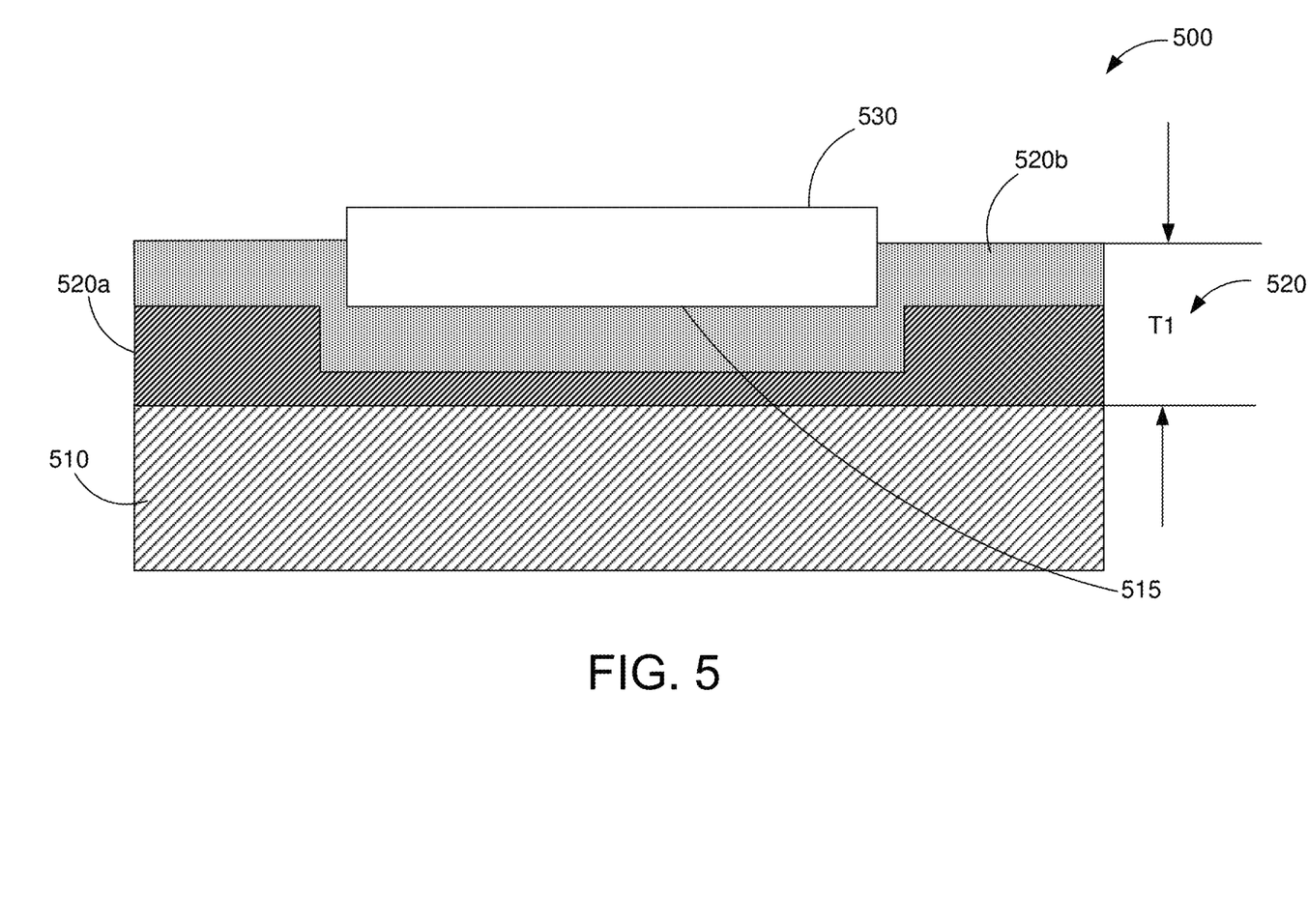
FIG. 5 a schematic, cross-sectional diagram illustrating a spacer with an embedded semiconductor die.

FIG. 5 a schematic, cross-sectional diagram illustrating a spacer assembly (assembly) 500 with an embedded semiconductor die. As noted above, the view of the assembly 500 shown in FIG. 5, for some implementations, can be a sectional view along a section line through the assembly 500 that generally corresponds with the section line S-S through the assembly 100 in FIG. 1.

As shown in FIG. 5, the assembly 500 includes a spacer 510, an adhesive (e.g., solder) portion 520 and a semiconductor die (die) 530. In comparison to the assemblies 200, 300 and 400, a cavity 515 is defined by (formed in, disposed in, etc.) the adhesive portion 520. As shown in FIG. 5, the adhesive portion 520 can include a first adhesive layer 520a that is disposed on the spacer 510, and a second adhesive layer 520b that is disposed on the first adhesive layer 520a. In some implementations, the adhesive layers 520a and 520b can each include different adhesives, such as solder alloys with different melting points. In some implementations, the adhesive layers 520a and 520b can each be implemented using at least one of a solder, a solder preform, a fluxless solder, a stamped solder preform, a solder paste, etc. For instance, in an example implementation, the adhesive layer 520a in FIG. 5 can include a solder paste, and the adhesive layer 520b can include a stamped solder preform.

After reflow of the adhesive layers 520a and 520, the die 530 can be electrically and/or thermal coupled with the spacer 510 (via the adhesive portion 520 of the assembly 500). Further, in the example implementation of FIG. 5, the die 530 is partially embedded in the cavity 515 (similar to the die 230 in the cavity 215 of the assembly 200). In some implementations, other arrangements of the elements of the assembly 500 are possible, such as different arrangements of the die 530 with respect to the spacer 510 and/or the cavity 515 (defined by the adhesive portion 520). As with the other implementations described herein, in a process for producing the assembly 500, an alignment jig can be used (e.g., during reflow of the adhesive layers 520a and/or 520b) to control the position of the die 530 relative to the spacer 510 and within the adhesive portion 520.

As also shown in FIG. 5, a circumferential ring of the solder portion 520 in the assembly 500 can have a thickness T1. In some implementations, the thickness T1 can be determined so as to control a volume of adhesive (solder) included in the adhesive portion 520, so that there is a sufficient volume of adhesive (solder) to prevent inadequate coverage and/or voids between the die 530 and the adhesive portion 520, e.g., to prevent cracking of the die 530 due to CTE mismatch of materials included in a semiconductor device assembly that includes the assembly 500.

Figure 6A:
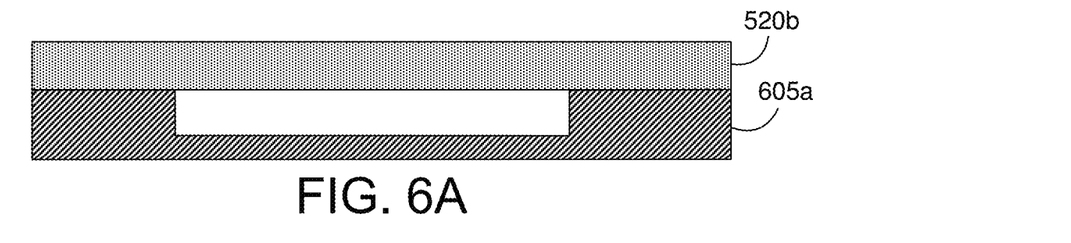
FIGS. 6A-6C are schematic, cross-sectional diagrams illustrating a process for producing a stamped solder preform.
Figure 6B:
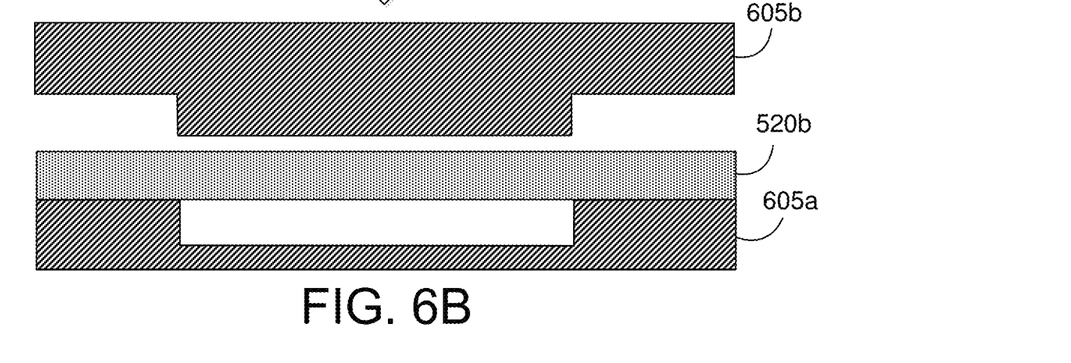
Figure 6C:
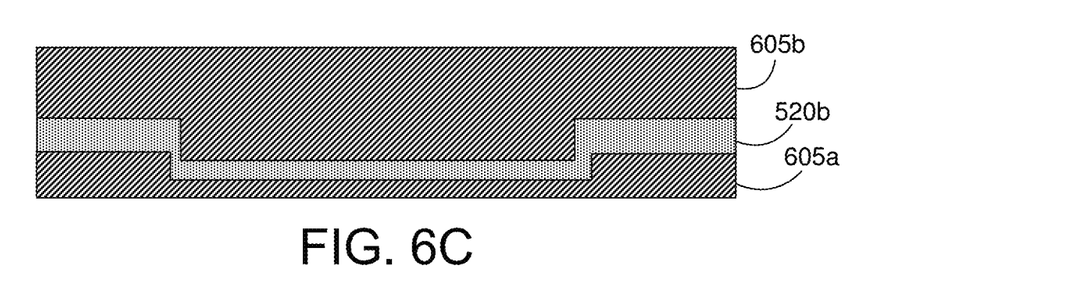

FIGS. 6A-6C are schematic, cross-sectional diagrams illustrating a process for producing a stamped solder preform that can be included in the spacer assembly of FIG. 5. For example, the process illustrated in FIGS. 6A-6C can, in some implementations, be used to form the solder preform 520b of FIG. 5. Accordingly, for purposes of illustration, and by way of example, the process of FIGS. 6A-6C is described with further reference to the solder preform (e.g., the stamped solder preform) 520b of FIG. 5. Also, similarly as was noted above with respect to FIGS. 2-5, the views of the process of FIGS. 6A-6C, for some implementations, can be sectional views along a section line through the solder preform 520b (and stamping tool) that generally corresponds with the section line S-S through the assembly 100 (e.g., the spacer 110) in FIG. 1.

As shown in FIG. 6A, the solder preform 520b (e.g. in the form of a planar solder preform) can be placed on a first portion 605a of a stamping tool, which can, in some implementations, be referred to as a stamping die. As shown in FIG. 6B, a second portion 605b of the stamping tool can be pressed downward (as indicated by the arrow in FIG. 6B) on the solder preform 520b and the first portion 605a of the stamping tool. As illustrated in FIG. 6C, after pressing the second portion 605b of the stamping tool onto the solder preform 520b, and the first portion 605a of the stamping tool, the solder preform 520b is stamped in the arrangement shown in FIGS. 5 and 6C to define the cavity 515.

Figure 7:
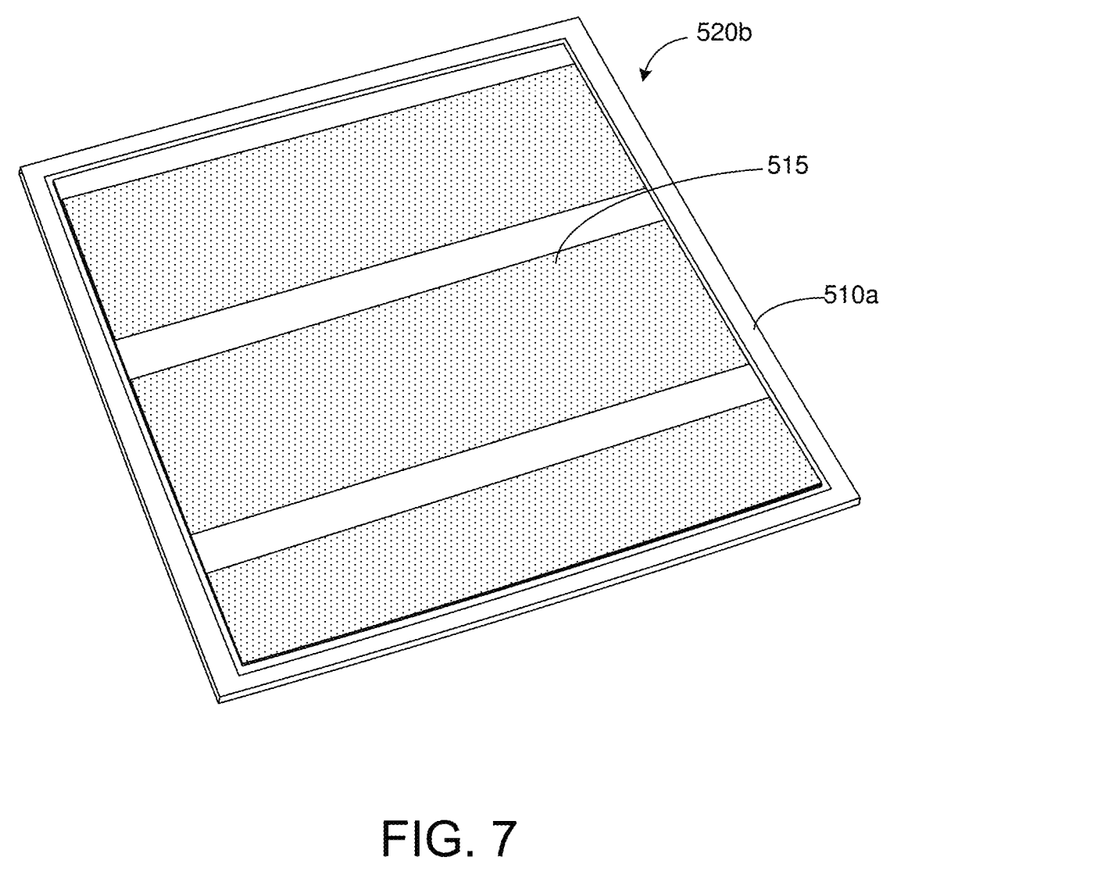
FIG. 7 is an isometric diagram illustrating a stamped solder preform that can be produced by the process of FIGS. 6A-6C.

FIG. 7 is a diagram illustrating a perspective view of an example implementation of the stamped solder preform 520b (e.g., that can be produced by the process of FIGS. 6A-6C). As shown in FIG. 7, the stamped solder preform 520b includes a circumferential ring 510a that surrounds (defines, etc.) the cavity 515 (e.g., as shown in FIGS. 5 and 6C). In some implementations, a solder preform (e.g., stamped solder preform) included in a spacer assembly, such as the assembly 500 (or other assemblies), can take different forms, or can be formed using different processes. For instance, a solder preform can be initially formed (without the need for stamping) having a configuration such as that of the stamped solder preform 520b, e.g., using a solder preform cast or mold.

Figure 8:
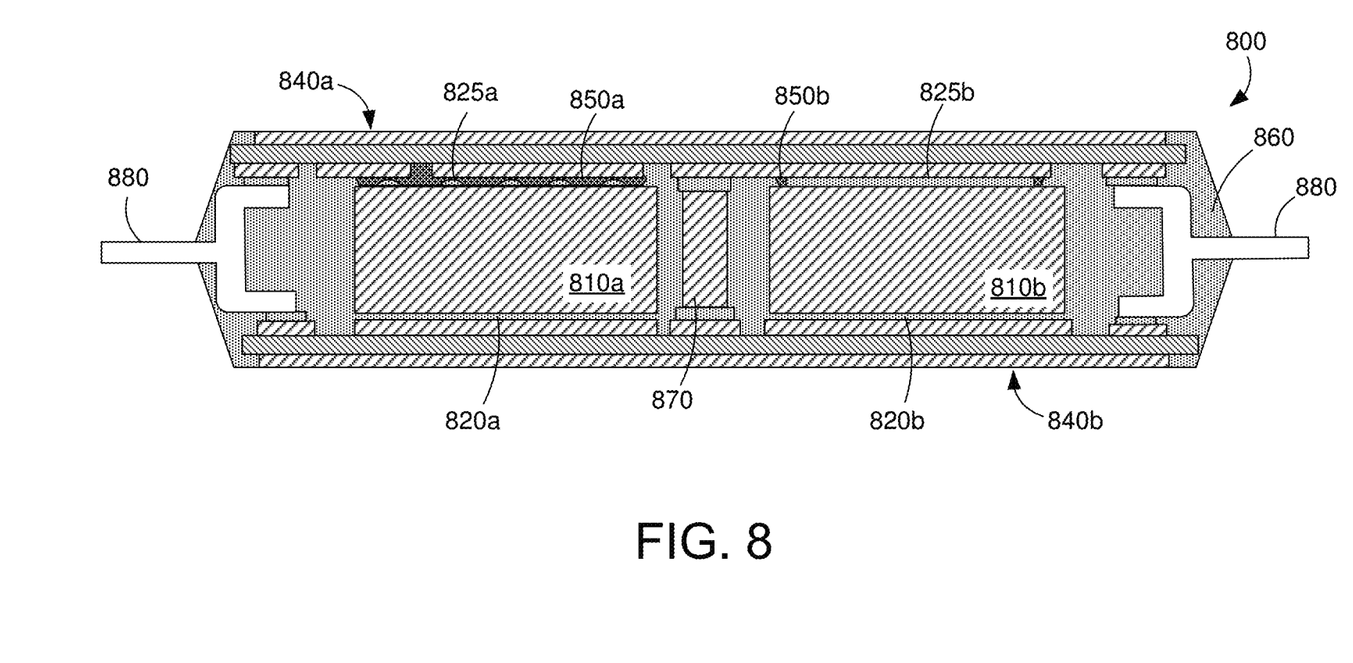
FIG. 8 is a schematic, cross-sectional diagram illustrating a semiconductor device assembly that includes a plurality of spacers with embedded semiconductor die.

FIG. 8 is a schematic, cross-sectional diagram illustrating a semiconductor device assembly (device) 800 that includes a plurality of spacers with embedded semiconductor die. In some implementations, the device 800 can include spacer assemblies such as the spacer assemblies 100, 200, 300, 400 and 500 described herein. The particular arrangement of the device 800 is shown by way of example and other spacer assemblies, or arrangements of the elements of the device 800 are possible, such as vertically stacking spacer assemblies (e.g., with an intervening DBM substrate), as compared to the laterally arranged spacer assemblies, as those shown in FIG. 8.

In the example implementation shown in FIG. 8, the device 800 includes a first spacer assembly 810a (e.g., including a first embedded semiconductor die and a first conductive spacer) and a second spacer assembly 810b (e.g., including a second embedded semiconductor die and a second conductive spacer). In the view shown in FIG. 8 the embedded semiconductor die of the spacer assemblies 810a and 810b are not visible, as, in this example, the semiconductor die are fully embedded in their corresponding spacers (conductive spacers), such as in the example implementations of FIGS. 3 and 4. In some implementations, spacer assemblies such those illustrated in FIG. 2 or 5 (or other spacer assemblies) can be included in the device 800 (or in other semiconductor device assemblies), e.g., in place of (or in addition to) the spacer assemblies 810a and 810b.

As shown in FIG. 8, the device 800 also includes a first DBM substrate 840a, and a second DBM substrate 840b. In the device 800, the semiconductor die of the first spacer assembly 810a can be electrically (and thermally) coupled with the DBM substrate 840a using conductive adhesive (e.g., solder connections) 825a, which can be include at least one of at least one of a solder bump, a preform solder, solder paste, sintering or a fusion bond, depending on the particular implementation. As further shown in FIG. 8, in the device 800, the semiconductor die of the second spacer assembly 810b can be electrically (and thermally) coupled with the DBM substrate 840a using conductive adhesive (e.g., solder connections) 825b, which can be include at least one of at least one of a solder bump, a preform solder, solder paste, sintering or a fusion bond, depending on the particular implementation. Further, in the device 800, the spacer of the first spacer assembly 810a can be coupled (e.g., electrically and/or thermally coupled) with the DBM substrate 840b using adhesive (conductive adhesive) 820a, which can be implemented using the approaches described herein. Similarly, in the device 800, the spacer of the second spacer assembly 810b can be coupled (e.g., electrically and/or thermally coupled) with the DBM substrate 840b using adhesive (conductive adhesive) 820b, which can be implemented using the approaches described herein.

The device 800 can also include low-modulus encapsulation material 850a (e.g., a gel material, an epoxy, a resin, and/or under-fill material, etc.), which can be injected between the first spacer assembly 810a and the DBM substrate 840a, such as shown in FIG. 8. Further, the device 800 can also include a low-modulus encapsulation material 850b (e.g., the same as, or different than the encapsulation material 850a), which can be injected between the second spacer assembly 810b and the DBM substrate 840a, such as shown in FIG. 8.

In some implementations, one, or both of the spacer assemblies 810a and 810b could be inverted (e.g., rotated 180 degrees from their arrangement shown in FIG. 8. For instance, in some implementations, the first spacer assembly could be inverted and the semiconductor die of the first spacer assembly 810a can be coupled (electrically and or thermally coupled) with the DBM substrate 840b, while the spacer of the first spacer assembly 810a can be coupled (electrically and or thermally coupled) with the DBM substrate 840a. In some implementations, the second spacer assembly 810b could be similarly inverted.

As shown in FIG. 8, the device 800 can also include a molding compound 860 that can encapsulate the spacer assemblies 810a and 810b, the low-modulus materials 850a and 850b, the DBM substrates 840a and 840b, as well as other elements of the device 800, such as those described herein. The molding compound 860 can be formed using vacuum molding, transfer molding, injection molding, or any appropriate molding process. In some implementations, the molding compound 860 can be an epoxy molding compound. As shown in FIG. 8, a surface of the DBM substrate 840a and a surface of the DBM substrate 840b can each be exposed through the molding compound 860 (e.g., using a post-mold grinding process). In some implementations, respective heat sinks can be coupled with the exposed surfaces of the DBM substrates 840a and 840b, e.g., to dissipate heat generated during operation of the device 800.

The device 800 of FIG. 8 can also include a conductive pillar (pillar) 870 that can electrically couple the DBM substrate 840a with the DBM 840b, and/or can provide mechanical support for (between) the DBM substrates 840a and 840b. As shown in FIG. 8, the pillar 870 can be encapsulated in the molding compound 860. The device 800 can also include signal terminals 880 that are coupled with the DBM substrates 840a and 840b (and are at least partially encapsulated in the molding compound 860). The signal terminals can be electrically coupled with, e.g., the semiconductor die of the spacer assemblies 810a and 810b, to carry power supply voltages, input signals and/or output signals during operation of the device 800.

Figure 9:
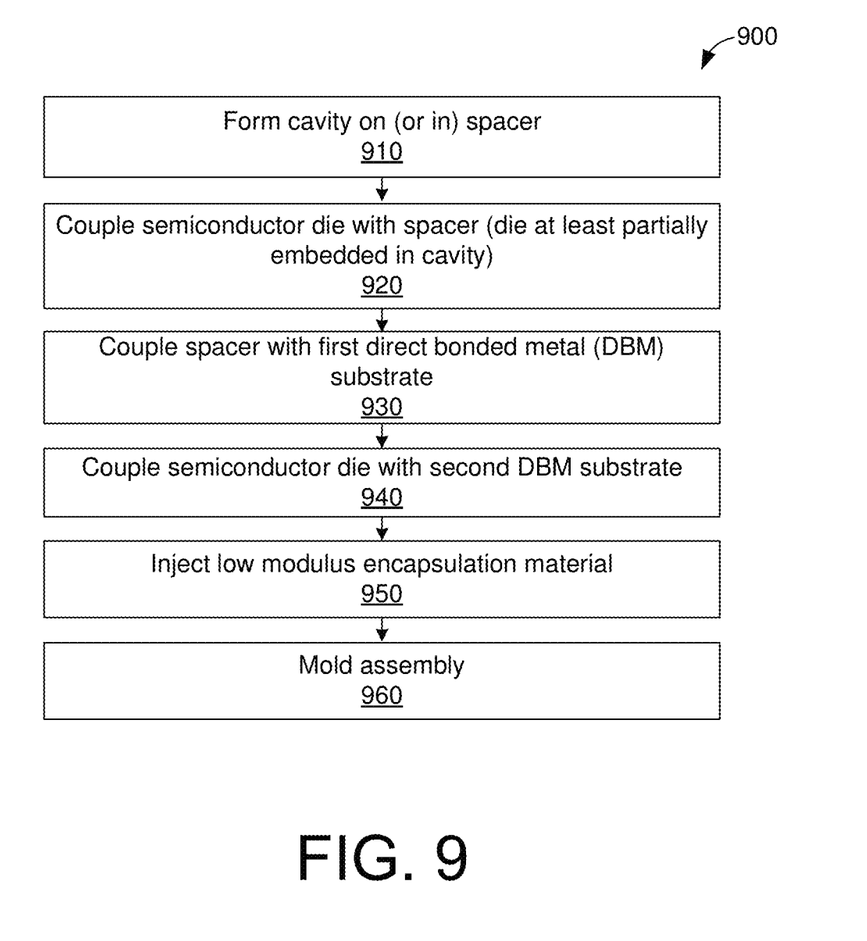
FIG. 9 is a flowchart illustrating a process for producing a semiconductor device assembly.

FIG. 9 is a flowchart illustrating an example implementation of a process 900 for producing a semiconductor device assembly. The process 900 can be used to produce a semiconductor device assembly (e.g., such as the device 800, or other device assembly) that includes spacer assemblies with embedded semiconductor die, such as the spacer assemblies 100, 200, 300, 400 and/or 500. In some implementations, spacer assemblies with embedded semiconductor die having other configurations can be included in a device produced using the method 900.

In the method 900, at block 910 a cavity can be formed in, or on a conductive spacer. For instance, a cavity such as one of the cavities 215, 315 or 415 could be formed in a conductive spacer. For example, as described herein, such a cavity can be formed using a stamping process, an etch process, or any appropriate process or combination of processes. In some implementations, a cavity such as the cavity 515 could be formed on a conductive spacer (e.g., using one or more adhesive layers, such as the stamped solder preform 520b and the adhesive (solder) layer 520a).

At block 920, a semiconductor die can be coupled with the spacer of block 910 (e.g., at least partially embedded in the cavity), such as by using one or more reflow operations to reflow, for example, one or more conductive adhesive (solder) layers. For example, in some implementations, a solder paste can be disposed in the cavity of block 910 and a first reflow process can be performed to reflow, and evenly distribute the solder paste in the cavity. In this example, after the first reflow process (and once the reflowed solder paste is hardened), the semiconductor die can be placed in the cavity and on the previously reflowed solder in the cavity. A second reflow process can then be performed to couple (electrically and/or thermally couple) the semiconductor die with the spacer, such as in one of the arrangements shown, for example, in FIG. 2, 3, 4 or 5, where a position of the semiconductor die in the cavity can be determined, at least in part, using an alignment jig. In some implementations (e.g., implementations using a solder preform instead of a solder paste), a single reflow process can be used to couple the semiconductor die with the spacer in the cavity at block 920. The number of reflow process performed at block 910 will depend on the particular implementation.

At block 930, the spacer can be coupled with a first DBM substrate, such the DBM substrate 840b in FIG. 8. For example, a solder (ball, preform, paste, etc.) can be applied and a reflow process can be performed. In some implementations, other process can be performed at block 930, such as sintering or fusion bonding, for example. At block 940, the semiconductor die can be coupled with a second DBM substrate, such the DBM substrate 840a in FIG. 8. For example, a solder (ball, preform, paste, etc.) can be applied and a reflow process can be performed. In some implementations, other process can be performed at block 940, such as sintering or fusion bonding, for example. In some implementations, the operations of block 920 to 940 can be performed using fluxless solder (paste, preforms, etc.) that can be reflowed using formic acid and/or forming gas.

At block 950, a low-modulus encapsulation material (such as a gel, an epoxy, a resin, and/or low-modulus under-fill material, etc.) can be injected between the spacer assembly of block 920 and the second DBM substrate of block 940 (such as the gel materials 450, 850a and 850b illustrated in FIGS. 4 and 8). At block 960, a molding process can be performed to encapsulate the device assembly, such as in a molding compound as shown in FIG. 8 (e.g., the molding compound 860), using an appropriate molding process. While the operations of FIG. 9 are shown in a particular order, in some implementations, these operations can be performed in other sequences. For instance, the order of blocks 930 and 940 could be reversed, and/or the gel material of block 950 could be injected earlier in the process 900, as some examples. Also, in some implementations, the process 900 can include additional, such as operations for producing a device with multiple spacer assemblies, including devices with laterally arranged spacer assemblies (e.g., the device 800), or devices with vertically stacked spacer assemblies that include an intervening DBM substrate between the spacer assemblies.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Silicon Carbide (SiC), Gallium Arsenide (GaAs), Gallium Nitride (GaN), and/or so forth.

While certain features of the described implementations have been illustrated as described herein, many modifications, substitutions, changes and equivalents will now occur to those skilled in the art. For instance, features illustrated with respect one implementation can, where appropriate, also be included in other implementations. For instance the, the low-modulus encapsulation material 450 of FIG. 4 could be included in, at least, the assemblies 100, 200, 300 and 500. Other features of the various implementations could also be similarly included in other implementation. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method for producing a semiconductor device assembly, the method comprising:
   defining a cavity in a conductive spacer;
   electrically and thermally coupling a semiconductor die with the conductive spacer, such that the semiconductor die is at least partially embedded in the cavity, the semiconductor die having:
      a first surface having active circuitry included therein;
      a second surface opposite the first surface; and
      a plurality of side surfaces each extending between the first surface of the semiconductor die and the second surface of the semiconductor die; and
   electrically coupling a direct bonded metal (DBM) substrate with the first surface of the semiconductor die.

2. The method of claim 1, wherein thermally and electrically coupling the semiconductor die with the conductive spacer includes thermally and electrically coupling the semiconductor die with the conductive spacer using an adhesive material disposed in the cavity.

3. The method of claim 2, wherein the adhesive material includes at least one of a solder, a solder paste, a preform solder or a fluxless solder material disposed in the cavity.

4. The method of claim 1, wherein:
   the second surface of the semiconductor die is fully embedded in the cavity of the conductive spacer; and
   the plurality of side surfaces of the semiconductor die are at least partially embedded in the cavity of the conductive spacer.

5. The method of claim 1, further comprising injecting a low-modulus encapsulation material, such that the low-modulus encapsulation material is:
   disposed between the conductive spacer and the DBM substrate; and
   disposed between the first surface of the semiconductor die and the DBM substrate.

6. The method of claim 5, wherein the low-modulus encapsulation material includes a silicone gel material.

7. The method of claim 5, further comprising encapsulating the semiconductor die, the conductive spacer, the low-modulus encapsulation material and the DBM substrate in a molding compound, such that a surface of the DBM substrate is exposed through the molding compound.

8. The method of claim 1, wherein the DBM substrate is a first DBM substrate and the cavity is disposed in a first surface of the conductive spacer, the method further comprising:
   coupling a second DBM substrate with a second surface of the conductive spacer, the second surface of the conductive spacer being opposite the first surface of the conductive spacer.

9. The method of claim 1, wherein:
   the conductive spacer includes a copper spacer; and
   defining the cavity includes mechanically stamping the cavity in a surface of the copper spacer.

10. The method of claim 1, wherein the cavity is defined using at least one of a solder paste or a stamped solder preform.

11. The method of claim 1, wherein:
   the cavity is defined in a surface of the conductive spacer; and
   the first surface of the semiconductor die is noncoplanar with the surface of the conductive spacer.

12. The method of claim 1, wherein:
   the cavity is defined in a surface of the conductive spacer; and
   the first surface of the semiconductor die is coplanar with the surface of the conductive spacer.

13. A method for producing a semiconductor device assembly, the method comprising:
   defining a cavity in a first surface of a conductive spacer;
   electrically and thermally coupling a semiconductor die, such that the semiconductor die is at least partially embedded in the cavity;
   electrically coupling a first direct bonded metal (DBM) substrate with a surface of the semiconductor die;
   coupling a second DBM substrate with a second surface of the conductive spacer, the second surface of the conductive spacer being opposite the first surface of the conductive spacer;

injecting a low-modulus encapsulation material between the conductive spacer and the first DBM substrate, and between the surface of the semiconductor die and the first DBM substrate; and encapsulating the semiconductor die, the conductive spacer, the low-modulus encapsulation material, the first DBM substrate, and the second DBM substrate in a molding compound.

14. The method of claim 13, wherein defining the cavity in the first surface of the conductive spacer includes stamping the cavity in the first surface of the conductive spacer.

15. The method of claim 13, wherein the low-modulus encapsulation material includes a silicone-based gel material.

16. The method of claim 13, wherein thermally and electrically coupling the semiconductor die with the conductive spacer includes electrically coupling the semiconductor die with the conductive spacer using a fluxless solder material disposed in the cavity.

17. A method for producing a semiconductor device assembly, the method comprising:

defining a cavity in a first surface of a first conductive spacer;

electrically and thermally coupling a first semiconductor die with the first conductive spacer, the first semiconductor die being at least partially embedded in the cavity of the first conductive spacer;

defining a cavity in a first surface of a second conductive spacer;

electrically and thermally coupling a second semiconductor die with the second conductive spacer, the second semiconductor die being at least partially embedded in the cavity of the second conductive spacer;

electrically coupling a first direct bonded metal (DBM) substrate with:
 a surface of the first semiconductor die; and
 a surface of the second semiconductor die; and electrically coupling a second DBM substrate with:
 a second surface of the first conductive spacer, the second surface of the first conductive spacer being opposite the first surface of the first conductive spacer; and
 a second surface of the second conductive spacer, the second surface of the second conductive spacer being opposite the first surface of the second conductive spacer.

18. The method of claim 17, further comprising injecting a low-modulus encapsulation material, such that the low-modulus encapsulation material is:

disposed between the first conductive spacer and the first DBM substrate;

disposed between the surface of the first semiconductor die and the first DBM substrate;

disposed between the second conductive spacer and the first DBM substrate; and disposed between the surface of the second semiconductor die and the first DBM substrate.

19. The method of claim 18, further comprising encapsulating the first semiconductor die, the second semiconductor die, the first conductive spacer, the second conductive spacer, the low-modulus encapsulation material, the first DBM substrate, and the second DBM substrate in a molding compound, a surface of the first DBM substrate being exposed through the molding compound, and a surface of the second DBM substrate being exposed through the molding compound.

20. The method of claim 17, wherein:

defining the cavity in the first surface of the first conductive spacer includes stamping the cavity in the first surface of the first conductive spacer; and defining the cavity in the first surface of the second conductive spacer includes stamping the cavity in the first surface of the second conductive spacer.

* * * * *